United States Patent [19]

von Basse et al.

[11] Patent Number: 4,958,319
[45] Date of Patent: Sep. 18, 1990

[54] ADDRESS AMPLIFIER CIRCUIT HAVING AUTOMATIC INTERLOCK AND PROTECTION AGAINST MULTIPLE ADDRESSING FOR USE IN STATIC GAAS RAMS

[75] Inventors: Paul-Werner von Basse, Wolfratshausen; Jean-Marc Dortu, Munich; Andrea Herlitzek, Munich; Dieter Kohlert, Munich; Ulrich Schaper, Munich, all of Fed. Rep. of Germany

[73] Assignee: Siemens Aktiengesellschaft, Berlin and Munich, Fed. Rep. of Germany

[21] Appl. No.: 409,578

[22] Filed: Sep. 19, 1989

[30] Foreign Application Priority Data

Oct. 14, 1988 [DE] Fed. Rep. of Germany ....... 3835116

[51] Int. Cl.⁵ .............................................. G11C 11/00
[52] U.S. Cl. ............................. 365/154; 365/230.06; 365/230.08; 307/445; 307/272.1
[58] Field of Search ...................... 365/230.05, 230.06, 365/230.08, 154; 307/445, 475, 272.1

[56] References Cited

U.S. PATENT DOCUMENTS

| | | | |
|---|---|---|---|
| 3,786,282 | 1/1974 | Orndorff | 307/445 |
| 4,077,031 | 2/1978 | Kitagawa et al. | |
| 4,692,633 | 9/1987 | Ngai et al. | 307/445 |
| 4,841,168 | 6/1989 | Kubota | 307/445 |
| 4,902,909 | 2/1990 | Chantepie | 307/272.1 |

FOREIGN PATENT DOCUMENTS 2625007 2/1977 Fed. Rep. of Germany .
2818350 10/1979 Fed. Rep. of Germany .

OTHER PUBLICATIONS

"Session XII: Memory I", by C. Norman Ahlquist et al., IEEE International Solid-State Circuits Conference (1976) p. 128.

Primary Examiner—Joseph E. Clawson, Jr.
Attorney, Agent, or Firm—Hill, Van Santen, Steadman & Simpson

[57] ABSTRACT

Address amplifier circuit having automatic interlock and protection against multiple addressing for use in static GaAs RAMs. In the address amplifier circuit the address is doubly stored and only those signals that cannot trigger a misdecoding are forwarded from the address amplifier to a decoder circuit.

2 Claims, 3 Drawing Sheets

ADDRESS AMPLIFIER CIRCUIT HAVING AUTOMATIC INTERLOCK AND PROTECTION AGAINST MULTIPLE ADDRESSING FOR USE IN STATIC GAAS RAMS

BACKGROUND OF THE INVENTION

In memory modules it is necessary to decode received addresses for the selection of individual memory cells in the memory modules. For a change of these addresses, intermediate conditions can occur, wherein two or more memory cells are simultaneously addressed particularly for slow or mutually shifted switching edges of the address signals. This can result in mutual overwriting of the memory cells and, thus, to a loss of data. This problem in the prior art particularly occurs in high-speed memories, where uncertainties in the timing of the address signals become especially significant with reference to the internal switching times of the memory modules.

One known solution used with dynamic memories is to inhibit the address decoders with an additional address decoder enable signal until the address signals are received at the decoders in a stable fashion. Only then is the decoding enabled, so that only one decoder can supply a selection signal in response to the stable address signals.

SUMMARY OF THE INVENTION

It is an object of the present invention to provide an address amplifier circuit having protection against multiple addressing for use in static GaAs RAMs.

This object is achieved by an address amplifier circuit for static RAMs having an address signal line, a first output signal line, A, and a second output signal line, $\overline{A}$. A first flip flop has a first reset logic element and a first set logic element, and a second flip flop has a second reset logic element and a second set logic element. A first NOR logic element and a second NOR logic element are also provided. A chip-enable signal line is connected to first inputs of the first NOR logic element, of the second NOR logic element, of the first set logic element and of the second set logic element. The address signal line is connected to a second input of the first NOR logic element and, via an inverter, to a second input of the second NOR logic element.

The outputs of the first set logic element and of the second set logic element are respectively connected to third and fourth inputs of the first NOR logic element and of the second NOR logic element. The output of the first NOR logic element is connected to a first input of the first reset logic element and the output of the second NOR logic element is connected to a first input of the second reset logic element. The output of the first reset logic element is connected to the first output signal line, A, and the output of the second reset logic element is connected to the second output signal line, $\overline{A}$.

In GaAs-DCFL (Direct Coupled FET Logic), the decoders are realized as NOR-gates, D0–D7. As an example, FIG. 1 shows the arrangement and decoding of a memory having 16 bits×1. As is typical, the memory cells, M, are arranged in columns and rows. One row (horizontal) is selected when the appertaining word line (output of the decoders, D0–D3, for the rows) carries a logical "1". In this case, the memory cell is connected to the corresponding, internal bit line. These internal bit lines are connected via switches, X1–X4, to an external bit line, EBL, from which the connection to the outside world occurs. It may be easily seen that two memory cells can be connected to one another for the simultaneous selection of two bit lines or word lines, which can potentially lead to the mutual overwriting of the stored information.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
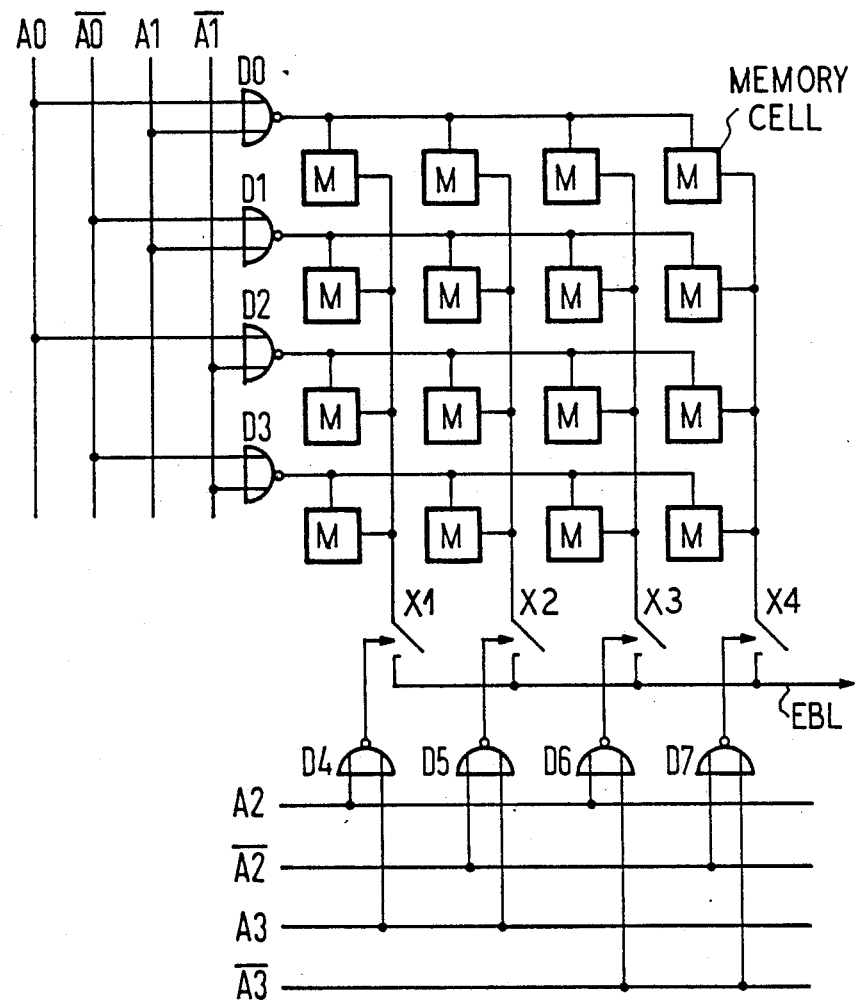
FIG. 1 shows a schematic illustration of a 16 bit memory with decoding.

It may be seen from FIG. 1 that a decoder output can only go to "1" when all inputs lie at "0". Address buffers usually are only inverters that forward the address signal and its inverse to the decoders. Undefined conditions during a change in the address are therefore forwarded to the decoders.

Figure 2:
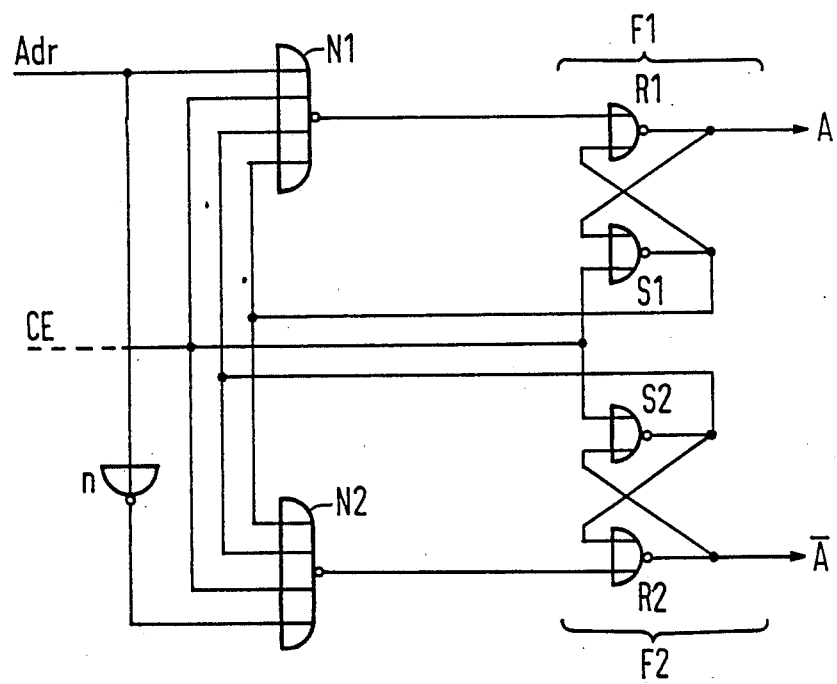
FIG. 2 shows an address amplifier circuit of the present invention.
Figure 3:
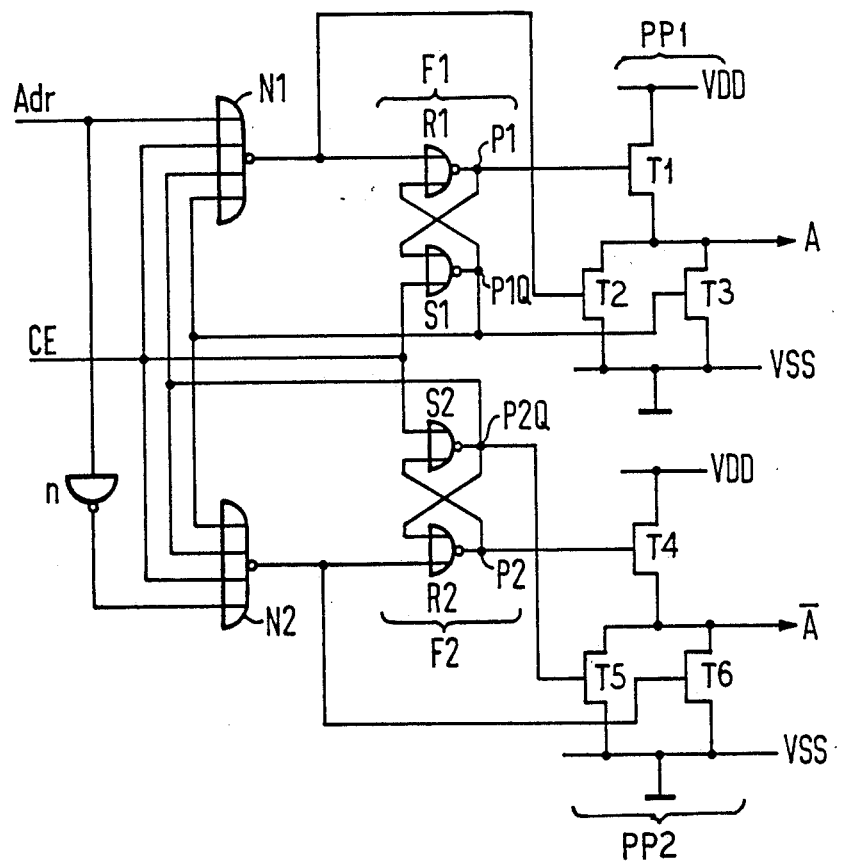
FIG. 3 shows the address amplifier circuit of the present invention in an advantageous embodiment of the output stages.

Referring now to FIGS. 2 and 3 and in order to be able to prevent the forwarding of undefined conditions to the address buffers, a chip-enable signal, CE, is required that indicates to the module whether it is in a pause condition or whether a write or read event is occurring. The state of this signal is usually defined such that a high level indicates the pause condition and a low level indicates the active (read or write) condition. This signal controls the address buffers that are now no longer formed as inverters but are constructed of two memory elements having the following properties (see FIGS. 2 and 3):

1. During the pause condition, all address buffer outputs carry a high potential.

2. The addresses are read in with the trailing edge of the chip-enable signal and are forwarded to the address decoder. All address buffer outputs are again switched to a high potential with the end of a memory activation, i.e. with the leading chip-enable edge.

This type of decoder drive causes only the address buffer outputs, A0 to A3 and A0 to A3, that should transmit a logical "0" to change their state. Since, as may be seen from FIG. 1, a line having a high potential blocks all connected decoder gates D0–D7, the last of the address buffer output line, A0 to A3 and to A0 to A3, that changes state to a low potential determines which word line is selected. Undefined conditions having a plurality of simultaneously selected word lines can thus no longer occur.

A self-interlocking technique is used for the acceptance of the addresses, ADR, with the trailing edge of the chip-enable signal, CE, (see FIG. 2): with the low level of the chip-enable signal, CE, gates N1, N2 to the address latches F1, F2 are opened, so that respectively one of the two address latches F1, F2 belonging to an address line receives a setting pulse and changes state dependent on the polarity of the address signal, ADR. Address latches F1, F2 are formed by NOR-gates R1, S1 and R2, S2, respectively. The output signal of the changed address latch in turn blocks the gates N1, N2, so that the address information is now stored regardless of following modifications of the level on the address lines, ADR. With the beginning of the pause condition, the address latches F1, F2, receive a reset signal due to the high level of the chip-enable signal, CE, this reset signal switching both outputs to high potential. FIG. 2 shows a fundamental circuit diagram of this arrangement.

It is to be understood that the outputs A and $\overline{A}$ of the circuit shown in FIG. 2 are, for example, the inputs A0, $\overline{A0}$ in the circuit of FIG. 1. The other pairs of FIG. 1 inputs A1, $\overline{A1}$; A2, $\overline{A2}$; and A3, $\overline{A3}$ have additional respective FIG. 2 circuits connected thereto.

More specifically, as shown in FIG. 2, the address amplifier circuit for static RAMs has an address signal line ADR, a first output signal line A, and a second output signal line $\overline{A}$. A first flip flop, F1, has a first reset logic element, R1, and a first set logic element, S1. A second flip flop, F2 has a second reset logic element R2, and a second set logic element, S2. A first NOR logic element, N1, and a second NOR logic element, N2, are provided.

A chip-enable signal line, CE, is connected to first inputs of the first NOR logic element, N1, and of the second NOR logic element, N2, and also to first inputs of the first set logic element S1 and of the second set logic element S2. The address signal line, ADR is connected to a second input of the first NOR logic element, N1, and, via an inverter, n, to a second input of the second NOR logic element, N2.

The outputs of the first set logic element, S1, and of the second set logic element, S2, are respectively connected to third and fourth inputs of the first NOR logic element, N1, and of the second NOR logic element, N2. The output of the first set logic element, S1, is also connected to a second input of the first reset logic element, R1. Similarly, the output of the second set logic element, S2, is also connected to a second input of the second reset logic element, R2.

The output of the first NOR logic element, N1, is connected to a first input of the first reset logic element, R1, and the output of the second NOR logic element, N2, is connected to a first input of the second reset logic element, R2.

The output of the first reset logic element, R1, is connected to the first output signal line, A, and to a second input of the first set logic element, S1, and the output of the second reset logic element, R2, is connected to a second output signal line, $\overline{A}$, and to a second input of the second set logic element, S2.

FIG. 3 shows a more practical embodiment of the address amplifier arrangement having additional measures for transit time optimization. The output stages that must drive the decoder lines are formed as a push-pull stage PP1, PP2 composed of normally-off transistors. The time span that is critical for the access time is the time from the trailing edge of the chip-enable signal up to the trailing edge of one of the two output signals. Transistors T1, T2 and T3 form the push-pull stage PP1 and transistors T4, T5 and T6 form the push-pull stage PP2 as shown in FIG. 3. A control input of transistor T1 is connected to output P1 of reset logic element R1; a control input of transistor T2 is connected to the output of gate N1; a control input of transistor T3 is connected to output P1Q of set logic element S1; a control input of transistor T4 is connected to output P2 of reset logic element R2; a control input of transistor T5 is connected to output P2Q of set logic element S2; and a control input of transistor T6 is connected to the output of gate N2.

This time span is shortened in that the signals are conducted directly from the gate N1, N2 to the push-pull stage PP1, PP2. As a result thereof, the address line is already pulled down before the address latch has stored the information after the two gate transit times (that is A; is more likely at "low" than PIA at "High").

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An address amplifier circuit for static RAMs having an address signal line (ADR), a first output signal line (A) and a second output signal line ($\overline{A}$), comprising:

a first flip flop (F1) having a first reset logic element (R1) and a first set logic element (S1), and a second flip flop (F2) having a second reset logic element (R2) and a second set logic element (S2);

a first NOR logic element (N1) and a second NOR logic element (N2);

a chip-enable signal line (CE) connected respectively to first inputs of the first NOR logic element (N1), of the second NOR logic element (N2), of the first set logic element (S1) and of the second set logic element (S2);

the address signal line (ADR) connected to a second input of the first NOR logic element (N1) and, via an inverter (n), to a second input of the second NOR logic element (N2);

outputs of the first set logic element (S1) and of the second set logic element (S2) respectively connected to third and fourth inputs of the first NOR logic element (N1) and of the second NOR logic element (N2);

an output of the first NOR logic element (N1) connected to a first input of the first reset logic element (R1) and an output of the second NOR logic element (N2) connected to a first input of the second reset logic element (R2); and an output of the first reset logic element (R1) connected to the first output signal line (A) and an output of the second reset logic element (R2) connected to the second output signal line ($\overline{A}$).

2. An address amplifier circuit for static RAMs having an address signal line (ADR), a first output signal line (A) and a second output signal line ($\overline{A}$), comprising:

a first flip flop (F1) having a first reset logic element (R1) and a first set logic element (S1) and a second flip flop (F2) having a second reset logic element (S1), and a second flip flop (F2) having a second reset logic element (R2) and a second set logic element (S2);

a first NOR logic element (N1) and a second NOR logic element (N2);

a chip-enable signal line (CE) connected to a first input of the first NOR logic element (N1), to a first input second NOR logic element (N2), to a first input of the first set logic element (S1) and to a first input of the second set logic element (S2);

the address signal line (ADR) connected to a second input of the first NOR logic element (N1) and, via an inverter (n), to a second input of the second NOR logic element (N2);

an output of the first set logic element (S1) connected to a third input of the first NOR logic element (N1), to a third input of the second NOR logic element (N2) and to a second input of the first reset logic element (R1);

an output of the second set logic element connected to a fourth input of the first NOR logic element (N1), to a fourth input of the second NOR logic element (N2) and to a second input of the second reset logic element (R2);

an output of the first NOR logic element (N1) connected to a first input of the first reset logic element (R1) and an output of the second NOR logic element (N2) connected to a first input of the second reset logic element (R2); and an output of the first reset logic element (R1) connected to the first output signal line (A) and to a second input of the first set logic element (S1), and an output of the second reset logic element (R2) connected to the second output signal line ($\overline{A}$) and to a second input of the second set logic element (S2).

* * * * *